United States Patent
Dieny et al.

(10) Patent No.: US 12,100,437 B2
(45) Date of Patent: Sep. 24, 2024

(54) MAGNETIC TUNNEL JUNCTION COMPRISING AN INHOMOGENEOUS GRANULAR FREE LAYER AND ASSOCIATED SPINTRONIC DEVICES

(71) Applicants: COMMISSARIAT À L'ENERGIE ATOMIQUE ET AUX ENERGIES ALTERNATIVES, Paris (FR); CENTRE NATIONAL DE LA RECHERCHE SCIENTIFIQUE (CNRS), Paris (FR); INSTITUT POLYTECHNIQUE DE GRENOBLE, Grenoble (FR)

(72) Inventors: Bernard Dieny, Grenoble (FR); Marco Mansueto, Grenoble (FR); Ricardo Sousa, Grenoble (FR); Ioan-Lucian Prejbeanu, Grenoble (FR); Liliana Buda-Prejbeanu, Grenoble (FR)

(73) Assignees: COMMISSARIAT A L'ENERGIE ATOMIQUE ET AUX ENERGIES ALTERNATIVES, Paris (FR); CENTRE NATIONAL DE LA RECHERCHE SCIENTIFIQUE (CNRS), Paris (FR); INSTITUT POLYTECHNIQUE DE GRENOBLE, Grenoble (FR)

(*) Notice: Subject to any disclaimer, the term of this patent is extended or adjusted under 35 U.S.C. 154(b) by 361 days.

(21) Appl. No.: 17/410,079

(22) Filed: Aug. 24, 2021

(65) Prior Publication Data
US 2022/0068339 A1  Mar. 3, 2022

(30) Foreign Application Priority Data
Aug. 25, 2020 (EP) .................... 20305949

(51) Int. Cl.
*G11C 11/16* (2006.01)
*G01R 33/09* (2006.01)
(Continued)

(52) U.S. Cl.
CPC .......... *G11C 11/161* (2013.01); *G01R 33/093* (2013.01); *G01R 33/098* (2013.01);
(Continued)

(58) Field of Classification Search
None
See application file for complete search history.

(56) References Cited

U.S. PATENT DOCUMENTS

| 7,126,202 | B2* | 10/2006 | Huai | H01F 41/303 257/E27.005 |
| 7,242,048 | B2* | 7/2007 | Huai | H01F 41/305 257/295 |

(Continued)

FOREIGN PATENT DOCUMENTS

EP   3 442 042 A1   2/2019

OTHER PUBLICATIONS

Extended European Search Report as issued in European Patent application No. 20305949.8, dated Feb. 3, 2021.
Reinsel, D., et al., "The Evolution of Data to Life-Critical; Don't Focus on Big Data; Focus on the Data That's Big," r Data Age 2025, Apr. 2017, 25 pages.
(Continued)

*Primary Examiner* — Kevin M Bernatz
(74) *Attorney, Agent, or Firm* — Pillsbury Winthrop Shaw Pittman LLP

(57) ABSTRACT

A magnetic tunnel junction includes at least one free layer, at least one reference layer, and at least one tunnel barrier separating the free layer and the reference layer, wherein the free layer is an inhomogeneous granular layer including at least two grains, each grain of the at least two grains being sensibly magnetically decoupled from the other adjacent grains of the at least two grains.

10 Claims, 12 Drawing Sheets
(9 of 12 Drawing Sheet(s) Filed in Color)

(51) Int. Cl.
  *H10B 61/00* (2023.01)
  *H10N 50/10* (2023.01)
  *H10N 50/80* (2023.01)
  *H10N 50/85* (2023.01)
(52) U.S. Cl.
  CPC .......... *G11C 11/1675* (2013.01); *H10B 61/00* (2023.02); *H10N 50/10* (2023.02); *H10N 50/80* (2023.02); *H10N 50/85* (2023.02)

(56) References Cited

U.S. PATENT DOCUMENTS

| | | | | |
|---|---|---|---|---|
| 7,486,551 | B1* | 2/2009 | Li | G11C 11/1675 |
| | | | | 365/158 |
| 10,672,446 | B2* | 6/2020 | Shibata | H10N 50/10 |
| 11,894,172 | B2* | 2/2024 | Shinohara | H10N 50/85 |
| 2006/0114620 | A1 | 6/2006 | Sbiaa et al. | |
| 2007/0085068 | A1* | 4/2007 | Apalkov | H01F 10/3259 |
| | | | | 257/1 |
| 2007/0176251 | A1* | 8/2007 | Oh | H10N 50/01 |
| | | | | 257/E43.006 |
| 2009/0109739 | A1 | 4/2009 | Ranjan et al. | |
| 2011/0303998 | A1* | 12/2011 | Ranjan | G11C 11/1673 |
| | | | | 257/E29.323 |
| 2012/0205763 | A1* | 8/2012 | Ranjan | B82Y 10/00 |
| | | | | 257/E29.323 |
| 2012/0242416 | A1* | 9/2012 | Katti | H01F 10/3218 |
| | | | | 427/128 |
| 2018/0180686 | A1* | 6/2018 | Ferreira | G01R 33/098 |
| 2019/0229260 | A1* | 7/2019 | Wang | G11C 11/5607 |
| 2019/0252601 | A1 | 8/2019 | Chatterjee et al. | |

OTHER PUBLICATIONS

Chua, L. O., "Memristor—The Missing Circuit Element," IEEE Transactions on Circuit Theory, vol. CT-18, No. 5, Sep. 1971, pp. 507-519.
Li, Y., et al., "Review of Memristor Devices in Neuromorphic Computing: Materials Science and Device Challenges," J. Phys. D: Appl. Phys., vol. 51, (2018), 27 pages.
Lequeux, S., et al., "A magnetic synapse: multilevel spin-torque memristor with perpendicular anisotropy," Sci. Rep. 6, (2016), 7 pages.
Fukami, S., et al., "Magnetization switching by spin-orbit torque in an antiferromagnet-ferromagnet bilayer system," Nat. Mater. 15, Feb. 2016, 8 pages.
Kurenkov, A., et al., "Artificial Neuron and Synapse Realized in an Antiferromagnet/Ferromagnet Heterostructure Using Dynamics of Spin-Orbit Torque Switching," Adv. Mater., 31, 1900636, (2019), 7 pages.
Raymenants, E., et al., "Chain of magnetic tunnel junctions as a spintronic memristor," J. Appl. Phys. 124, 152116, (2018), 7 pages.
Siddiqui, S. A., et al., "Magnetic Domain Wall Based Synaptic and Activation Function Generator for Neuromorphic Accelerators," Nano Lett. 20, (2020), pp. 1033-1040, DOI:10.1021/acs.nanolett. 9b04200.
Weller, D., et al., "A HAMR Media Technology Roadmap to an Areal Density of 4 Tb/in$^2$," IEEE Transactions on Magnetics, vol. 50, No. 1, Jan. 2014, 8 pages.
Garello, K., et al., "SOT-MRAM 300mm integration for low power and ultrafast embedded memories," 2018 IEEE Symposium on VLSI Circuits, 978-1-5386-4214-6, (2018), 2 pages.

* cited by examiner

PRIOR ART

PRIOR ART

PRIOR ART

PRIOR ART

PRIOR ART

MAGNETIC TUNNEL JUNCTION COMPRISING AN INHOMOGENEOUS GRANULAR FREE LAYER AND ASSOCIATED SPINTRONIC DEVICES

CROSS-REFERENCE TO RELATED APPLICATIONS

This application claims priority to European Patent Application No. 20305949.8, filed Aug. 25, 2020, the entire content of which is incorporated herein by reference in its entirety.

FIELD

The technical field of the invention is the field of spintronics.

The present document concerns a multivalued spintronic device and in particular a multivalued spintronic device operating on the principle of tunnel magnetoresistance.

BACKGROUND

The technological developments in the last few decades led to a deep transformation of our society which is now a society of information, communication and big data. The amount of data produced worldwide grows exponentially, doubling every 2 years. It has reached 20 Zettabytes (20 billion Terabytes) in 2018 as described in [D. Reinsel, J. Gantz and J.Rydning, *The Evolution of Data to Life-Critical Don't Focus on Big Data; Focus on the Data That's Big*, IDC White Paper Data Age 2025, April (2017)]. Correlatively, the worldwide power consumption associated with the information and communication technology (ICT) keeps on increasing exponentially. It represented about 10% of the overall electrical power consumption in 2018. This steadily increasing electrical power consumption is a concern for the sustainability of these technologies. One reason of this large power consumption lies in the most common architecture developed for digital world: the Von Neumann architecture. The main cause is the separation between the computational unit and the storage unit. The transfer of information between the two units is taking more time and consuming more power than the data processing itself. Another cause of the large power consumption of ICT is associated with the wireless transmission of data. In wearable applications and particularly smartphones, as in the interconnected objects of the Internet of Things (IoT), the main source of power consumption is associated with the wireless transmission of data to the cloud. It would be very efficient in terms of power consumption to be able to analyse the collected data directly at the chip level so as to filter the useful data to be transmitted while eliminating the useless ones. This requires a very low power on chip computing capability.

In addition, there is an increasing concern in terms of privacy and security for transmitting personal data to the cloud. Again, it would be much better if the personal data could be processed locally instead of being transmitted to the cloud.

For all these reasons, there is a strong motivation for developing artificial intelligence (AI) able to deal with massive amounts of data generated in order to extract the useful information out of it. There is a particularly strong motivation to develop edge AI, i.e. AI at the chip level in order to limit the amount of information that needs to be transferred to the cloud.

Artificial intelligence was born with the purpose of mimicking the brain performances that is able to process very efficiently a huge amount of information and with a very low power consumption. The reason for this stands in the massive parallelization of computational units, i.e. neurons, and memory units as synapses. Several kinds of architectures have been conceived in order to achieve these characteristics. The neural networks, implemented as algorithms in conventional Von Neumann machines, have shown major improvements for specific tasks such as pattern recognition but with very high-power consumption. The realization of a low-power artificial intelligence (i.e. of the order of 20 W as in the human brain) requires the development of a proper hardware that, as in the case of the brain, will implement devices mimicking neuronal and synaptic functions.

In this context, a certain number of devices have been developed to mimic spiking neurons, and others to mimic synapses such as analog (or multilevel) memories. In this type of memories, the stored state depends on the history of the current which traversed the device. This is defined as a memristor function by [L. O. Chua, *Memristors-the missing circuit element, IEEE Trans. Circuit Theory* CT-18, 507 (1971)]. Examples of memristors are based on different kinds of technologies. In resistive oxides-based technology, for example using TiO, a strong voltage with both polarities is applied in order to make the oxygen ions migrate, thus gradually varying the resistance of the device as in [Y. Li, Z. Wang, R. Midya, Q. Xia, and J. J. Yang, *Review of memristor devices in neuromorphic computing: Materials sciences and device challenges*, J. Phys. D: Appl. Phys. 51, 503002 (2018)].

In the spintronic field, several devices have been proposed. A first example is based on the displacement of a magnetic domain wall in the free layer of a magnetic tunnel junction (MTJ) in [S. Lequeux, J. Sampaio, V. Cros, K. Yakushiji, A. Fukushima, R. Matsumoto, H. Kubota, S. Yuasa, and J. Grollier, *A magnetic synapse: Multilevel spin-torque memristor with perpendicular anisotropy*, Sci. Rep. 6, 31510 (2016)]. A schematic of a device according to this first example is shown in FIG. 1a and extracted from said document. The free layer of FeB is pinned to a synthetic antiferromagnet based on a Co/Pt multilayer. The domain wall is created in the free layer of FeB that, together with an MgO barrier, gives a tunnel magnetoresistance (TMR) of up to 95%. The shape of the device is properly designed to have a nucleation pad and a micrometer long track as shown in the SEM top view of FIG. 1a. The domain wall is created in the nucleation pad and displaced in the track thanks to the DC current exerting a spin transfer torque (STT) on the magnetization. When the domain wall is pinned at a certain position, the resistance state results from the ratio between parallel and antiparallel configuration. That way, the tunnel magnetoresistance (TMR) shows a number of intermediate states that depends on the number of natural pinning sites and artificially created ones as shown in FIGS. 1b and 1c. FIG. 1b shows a resistance loop as a function of the applied DC current with an out-of-plane field of Hz=85 Oersted. FIG. 1c shows the result of micromagnetic simulations of the domain wall displacement in the device.

In this type of device, the stability of the resistance states as well as their number are hardly controllable. Moreover, the device turns out to be not scalable since the number of states is proportional to the physical lateral size.

Another proposal exploits the exchange bias between an antiferromagnetic material with an in-plane Néel vector and an out-of-plane magnetized ferromagnet, in [S. Fukami, C. Zhang, S. DuttaGupta, and H. Ohno, *Magnetization switch-*

*ing by spin-orbit torque in an antiferromagnet-ferromagnet bilayer system, Nat. Mater.* 15, 535 (2016).]. The structure, as depicted in FIG. 2a, is conceived to enable field free switching of the out-of-plane ferromagnetic layer (Co/Ni multilayer) exploiting the spin orbit torque (SOT) originating from a current flowing in the adjacent antiferromagnet (PtMn) line. In a large dot (at least 5 µm of lateral size) the magnetization reversal occurs in a gradual way giving rise to a resistance variation as shown in FIG. 2b. FIG. 2b shows resistance loops as a function of current pulses in a device according to FIG. 2a.

This system showed spike-timing-dependent plasticity (STDP) with sub-microsecond bipolar pulses as shown in FIG. 2c, which displays the dependence of the resistance variation on the delay between pre- and post-synaptic pulses.

The same structure is also used as spiking neuron in smaller dots of 100 nm where the binary nature of the magnetization is exploited. The regular train of pulses sent as input is designed in amplitude and frequency to excite the magnetization with a certain switching probability from 0 to 1 as can be seen at FIG. 2d, showing the dependence of the switching probability on the frequency of the input train of pulses. The magnetization then switches in a statistical way giving rise to a train of resistance spikes whose frequency depends on the frequency of the input train of pulses, as explained in [A. Kurenkov, S. D. Gupta, C. Zhang, S. Fukami, Y. Horio, and H. Ohno, *Artificial Neuron and Synapse Realized in an Antiferromagnet/Ferromagnet Heterostructure Using Dynamics of Spin-Orbit Torque Switching, Adv. Mater.,* 31, 1900636 (2019).]. The FIGS. 2a to 2d are extracted from said document or from [S. Fukami, C. Zhang, S. DuttaGupta, and H. Ohno, *Magnetization switching by spin-orbit torque in an antiferromagnet-ferromagnet bilayer system, Nat. Mater.* 15, 535 (2016)]

The size of the device represents a limit for the scalability and for the creation of dense arrays of devices. Moreover, the presence of the antiferromagnetic material imposes an important restriction on the working temperature of the device because of the relatively steep temperature dependence of the exchange bias.

A third proposal consists in using a series of bistable MTJs connected in series as multilevel resistor switched gradually by STT. In [E. Raymenants, A. Vaysset, D. Wan, M. Manfrini, O. Zografos, O. Bultynck, J. Doevenspeck, M. Heyns, I. P. Radu, and T. Devolder, *Chain of magnetic tunnel junctions as a spintronic memristor, J. Appl. Phys.* 124, 152116 (2018).], a series of ten MTJs of 100 nm of diameter each is fabricated as represented at FIG. 3a. A discrete number of resistance states can be reached by field or by STT as shown in FIG. 3b, by gradually switching the MTJs. FIG. 3b shows resistance states as a function of the magnetic field (left) or of voltage pulses (right). In this case, the number of resistance states is limited by the number of MTJs present in the chain (N+1 states for N MTJs). A larger number of states can be achieved by resetting the chain after each pulse. In such case, a chain of perfectly equal MTJs would give the distribution shown in FIG. 3c with the N+1 states while, by considering the variability in the MTJ fabrication process, a spread of the resistance distribution would allow an almost continuous range of resistance as in FIG. 3d. FIG. 3c shows the resistance states distribution with small MTJ variability (with standard deviation σ of 0.0001 and 0.5), while FIG. 3d shows the resistance states distribution with higher MTJ variability (with standard deviation σ of 0.5). The FIGS. 3a to 3d were extracted from [E. Raymenants, A. Vaysset, D. Wan, M. Manfrini, O. Zografos, O. Bultynck, J. Doevenspeck, M. Heyns, I. P. Radu, and T. Devolder, *Chain of magnetic tunnel junctions as a spintronic memristor, J. Appl. Phys.* 124, 152116 (2018)].

Other works implement the use of several MTJ connected in parallel as in [S. A. Siddiqui, S. Dutta, A. Tang, L. Liu, C. A Ross and M. A Baldo, *Magnetic Domain Wall Based Synaptic and Activation Function Generator for Neuromorphic Accelerators, Nano Lett.* 20, 1033 (2020) DOI: 10.1021/acs.nanolett.9b04200], where the magnetic domain wall motion on a common free layer controls the configuration of each MTJ achieving different resistance states. All those devices share the advantages of reliability and endurance, typical of the state of the art of Magnetic Random-Access Memory ("MRAM") technology. Despite this, the large footprint needed for the realization of such devices does not make them eligible for large circuit integration.

It is important to note that besides the possibility to use these devices as memristors for artificial intelligence purposes, such devices can be used as a multivalued memory element, i.e. a memory having intermediate states. It is understood by a device having intermediate states that it does not only have two states (Rmin and Rmax) as in conventional binary memory elements, but it has a number of intermediate resistance states between Rmin and Rmax, thus allowing to increase the capacity of a memory chip by increasing the number of states rather than increasing the number of memory cells.

In conclusion, all prior art spintronic memristors have drawbacks either in terms of downsize scalability (too large footprint), ability to control the various intermediate resistance states or high sensitivity to operating temperature. There is therefore a need for a spintronic memristor/multivalued memory device approach which does not exhibit these drawbacks.

SUMMARY

The present document solves the above-mentioned problems by providing solutions for spintronic devices that are multivalued, scalable and permit a freedom in the control of the resistance variation of the devices and particularly the number of intermediate resistance states achievable.

According to a first aspect of the invention, this is satisfied by providing a magnetic tunnel junction comprising at least one free layer, at least one reference layer, and at least one tunnel barrier separating the free layer and the reference layer, wherein the free layer is an inhomogeneous granular layer comprising at least two grains, each grain of the at least two grains being sensibly magnetically decoupled from the other adjacent grains of the at least two grains.

Thanks to the invention, multiple resistive states are reached by gradually switching the magnetization of each grain (or of groups of a few grains) of the free layer. This can be achieved thanks to the fact that the grains are sensibly magnetically decoupled between them. The grains are magnetically decoupled or weakly coupled across their grain boundaries to be able to switch the grains individually or by small groups of grains.

It is understood by "sensibly decoupled" the fact that two adjacent grains are magnetically decoupled or weakly coupled, i.e. that the exchange coupling between adjacent grains though their grain boundary is sufficiently weak so that the magnetization of a given grain can be reversed without yielding the reversal of the magnetization of the adjacent grain. For instance, if it is considered as a schematic representation two adjacent square grains of height h, where h is generally the thickness of the free layer, and of lateral dimension d in contact by one of their side face, the coupling energy Adh between the two grains (where A is the coupling energy per unit area and dh is the area of the face to face contact between the two grains, 4 dh being the lateral area of the considered grain) should be significantly lower than the anisotropy energy of a given grain $K_{eff}hd^2$, where $K_{eff}$ is the effective anisotropy per unit volume of the grains and $hd^2$ the grain volume. By "significantly lower", it is understood for example by at least a factor 8, considering that a given grain can have 4 such adjacent neighbouring grains and the coupling energy should not exceed half of the anisotropy energy to also withstand the influence of thermal activation. This yields the condition $A<⅛\ K_{eff}d$ or in other words, the intergrain coupling energy integrated over the lateral area of a given grain should not exceed half of the effective anisotropy energy of the considered grain integrated on its volume. Naturally, for grains of different shapes, the man skilled in the art will know how to adapt the previous formulas.

The gradual switching of the magnetization of each grain is performed by using spin-polarized current pulses with duration and amplitudes for which the switching probability is lower than 100%. At each spin-polarized current pulse, the magnetic moments of the grains have a certain probability to switch because of the intrinsic stochastic nature of spin-transfer torque (STT) or of the spin-orbit torque (SOT) switching and/or because of the existence of a distribution of grain size and composition resulting in a distribution of anisotropy. Because of the tunnel magnetoresistance of the magnetic tunnel junction, this partial switching of the storage layer magnetization results in intermediate resistance states between the two extreme values corresponding to the two configurations where the free layer magnetization is either uniformly saturated parallel or antiparallel to the reference layer magnetization.

Recording media used in recording technology such as in hard disk drives are also made of granular media. However, a very significant difference between recording media and the present invention is that in recording media, all grains of a written bit are switched at once by the pulse of magnetic field provided by the write head. In the present invention, on the contrary, the probabilistic switching of the grains under STT or SOT current pulses is taken advantage of to switch the grains one by one or by batch of a few grains to create intermediate levels of resistance.

It is understood by "grain" a volume in a polycrystalline material, the volume having a specific magnetization orientation. It is understood by "a granular layer", a layer that comprises a plurality of grains. It is understood by "inhomogeneous layer" a layer that comprises magnetic inhomogeneities, i.e. a layer comprising a plurality of regions separated by interregional zones wherein the exchange stiffness is lower than the exchange stiffness within the said regions.

The lateral dimension of the device as well as the simple structure of the device, basically similar to a standard MRAM cell, ensure good scalability and easy integrability in dense arrays for the creation of a full circuit. Moreover, the current pulses characteristics (amplitude and duration) can be adjusted to achieve different switching probabilities which provides degrees of freedom in the control of the resistance variation of the device and particularly the number of intermediate resistance states that one wants to achieve.

Furthermore, the invention can be reached by different embodiments which will be described further in the detailed description, permitting freedom in its implementation and adaptability to existing devices. For example, the invention is compatible with at least STT or SOT writing mechanisms, and at least in-plane or out-of-plane magnetic tunnel junctions.

The magnetic tunnel junction according to the first aspect of the invention may also have one or more of the following characteristics, considered individually or according to any technically possible combinations thereof:
  each grain of the at least two grains is sensibly magnetically decoupled from the other adjacent grains of the at least two grains when the intergrain coupling energy integrated over the lateral area of said grain does not exceed half of the effective anisotropy energy of said grain integrated on its volume.
  the grains have a size comprised between 3 nanometers and 30 nanometers.
  the inhomogeneous granular free layer is at least a bilayer comprising a ferromagnetic layer and an antiferromagnetic layer.
  the inhomogeneous free layer is at least a trilayer comprising two ferromagnetic layers separated by an antiferromagnetic layer.
  the inhomogeneous free layer comprises a heterogeneous alloy of at least two immiscible phases, the alloy comprising at least a magnetic material and a non-magnetic material.
  the non-magnetic material is an oxide.

Another aspect of the invention relates to a multivalued non-volatile memory element comprising a magnetic tunnel junction according to the invention.

The multivalued non-volatile memory element according to the other aspect of the invention may also have one or more of the following characteristics, considered individually or according to any technically possible combinations thereof:
  the element is a magnetic random-access memory element of the "spin-transfer torque" type or "STT-MRAM".
  the element is a magnetic random-access memory element of the "spin-orbit torque" type or "SOT-MRAM".

Another aspect of the invention relates to a process of writing a multivalued non-volatile memory element according to the invention, the process comprising at least the step of applying a current pulse of a predefined amplitude and duration to reverse the magnetization orientation of at least part of the grains of the inhomogeneous granular free layer.

The amplitude and duration of the current pulse may be predefined such that the probability of reversing the magnetization orientation of the at least part of the grains of the inhomogeneous free layer by applying the current pulse is k/N, with k a number inferior to N and with N the number of grains of the inhomogeneous granular free layer.

Another aspect of the invention relates to a memristor comprising a multivalued non-volatile element according to the invention.

Another aspect of the invention relates to a neuromorphic circuit comprising at least a memristor according to the invention.

The invention can have several applications, for example as a memristor, a neuromorphic circuit comprising at least such a memristor, as a multivalued memory for STT-MRAM, SOT-MRAM or any other suitable application.

BRIEF DESCRIPTION OF THE FIGURES

The patent or application file contains at least one drawing executed in color. Copies of this patent or patent application publication with color drawing(s) will be provided by the Office upon request and payment of the necessary fee.

Other characteristics and benefits of the invention will become clear from the description that is given thereof below, by way of indication and in no way limiting, with reference to the appended figures, among which.

DETAILED DESCRIPTION

For greater clarity, identical or similar elements are marked by identical reference signs in all of the figures.

Figure 1A:
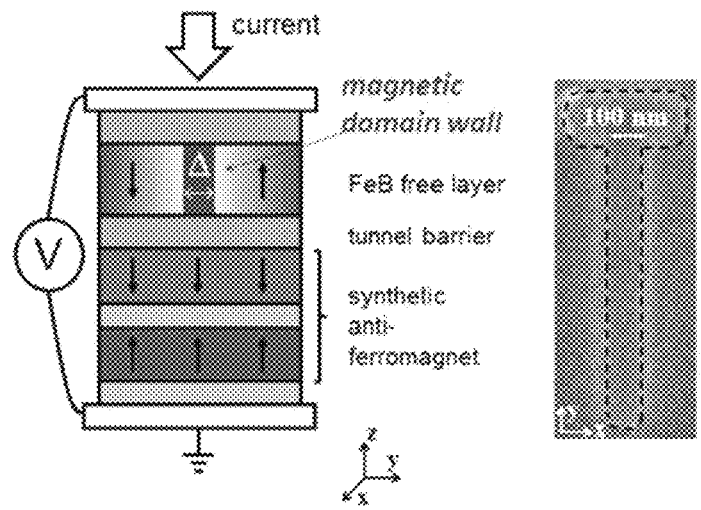
FIGS. 1a to 1c are schematic representations related to a device of the state of the art comprising a magnetic tunnel junction having a displaceable magnetic domain wall in its free layer.
Figure 1B:
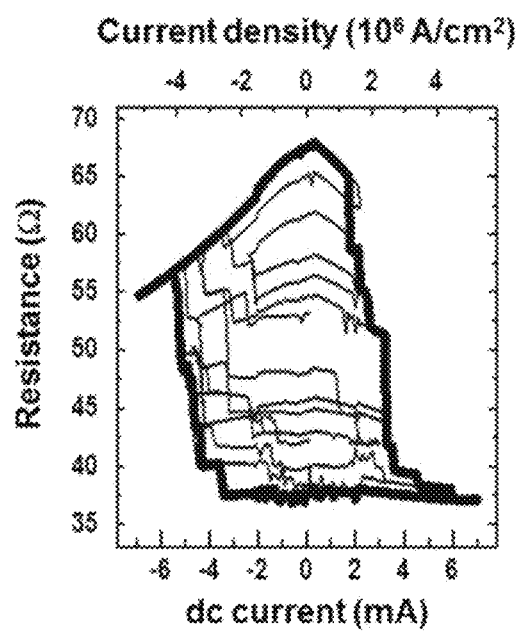
Figure 1C:
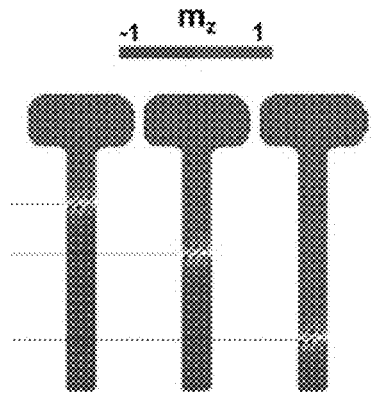
Figure 2A:
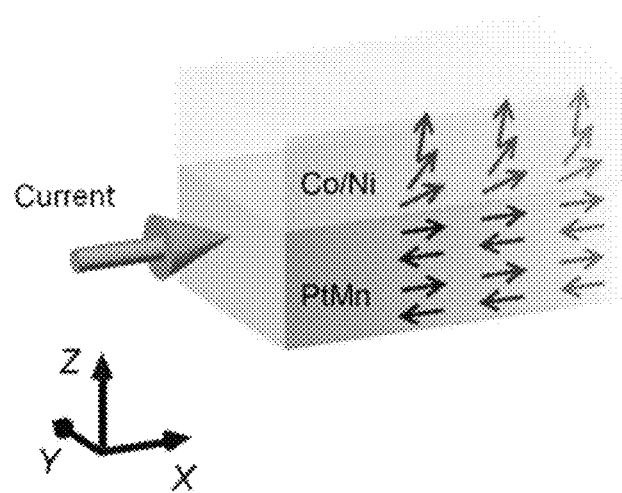
FIGS. 2a to 2d are schematic representations related to another device of the state of the art exploiting the exchange bias between an antiferromagnetic material with an in-plane Néel vector and an out-of-plane magnetized ferromagnet.
Figure 2B:
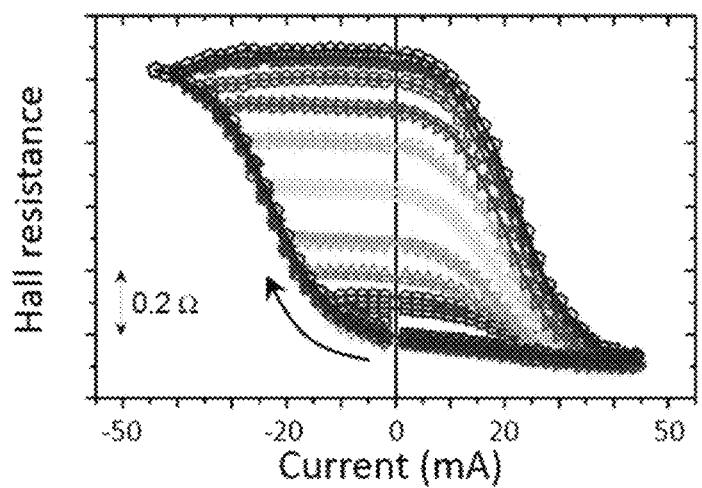
Figure 2C:
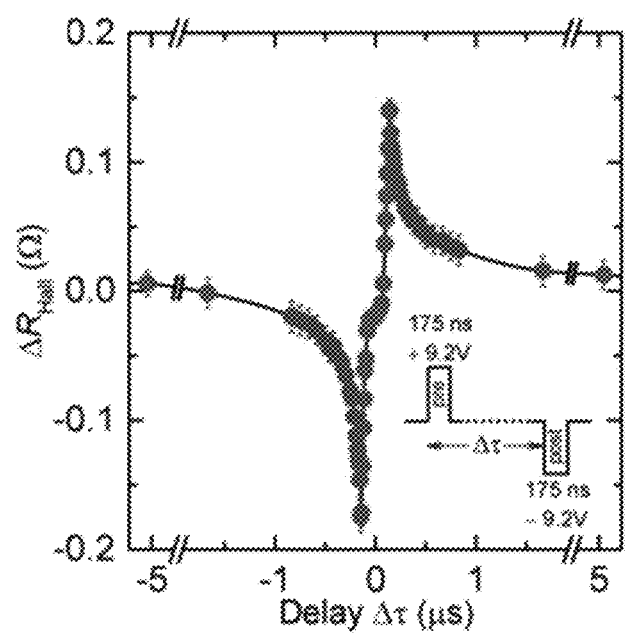
Figure 2D:
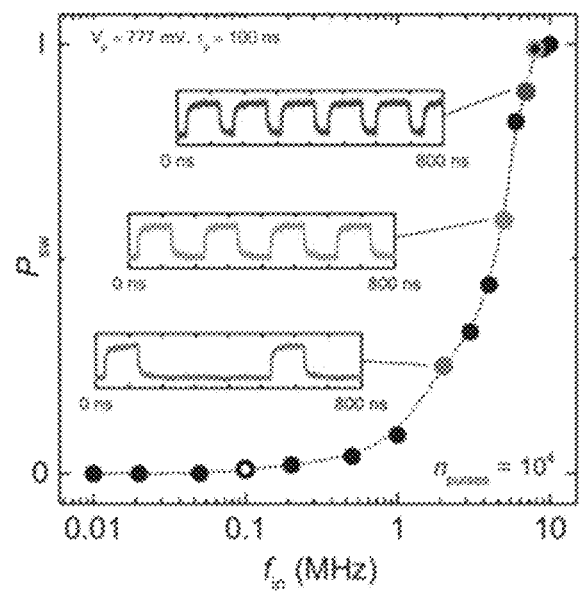
Figure 3A:
FIGS. 3a to 3d are schematic representations related to a system of the state of the art comprising a series of bistable MTJs connected in series to be used as a multilevel resistor switched gradually by STT.
Figure 3B:
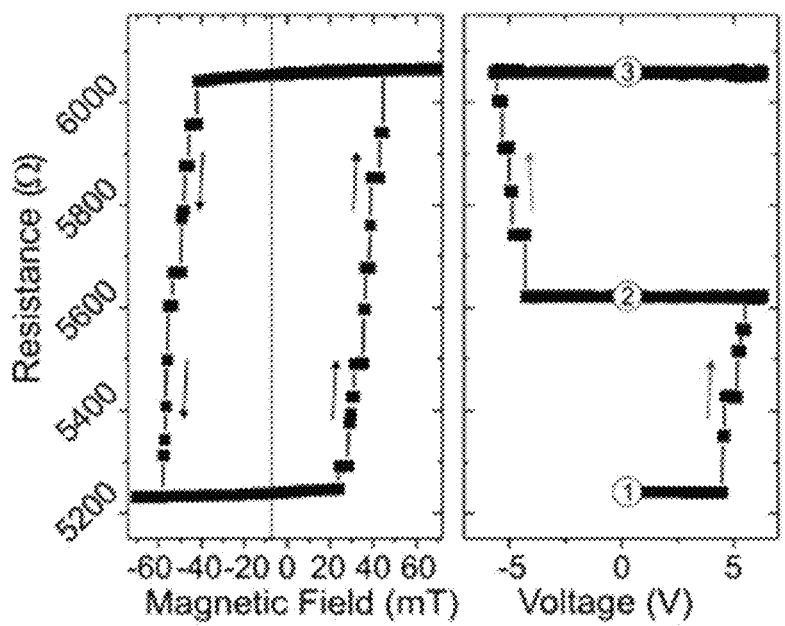
Figure 3C:
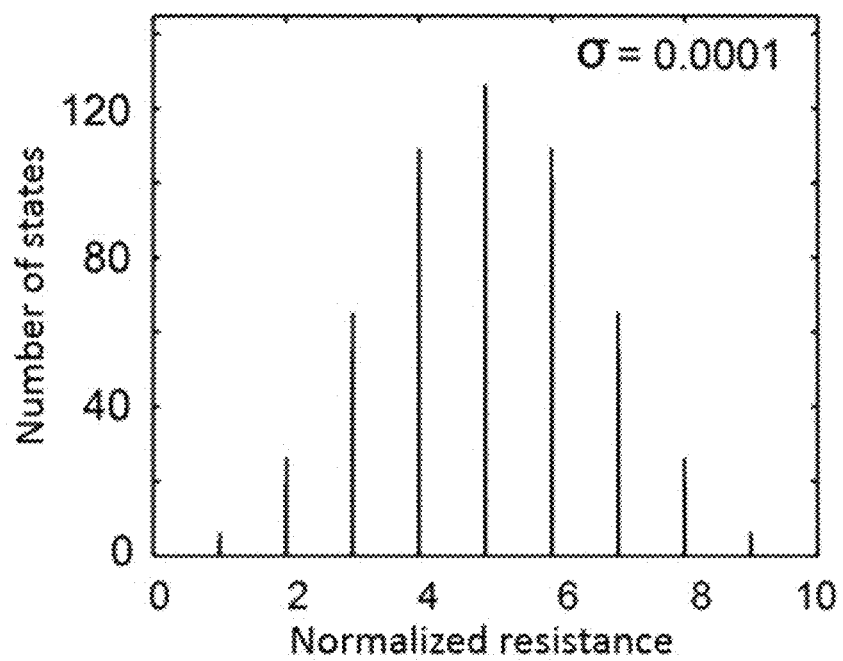
Figure 3D:
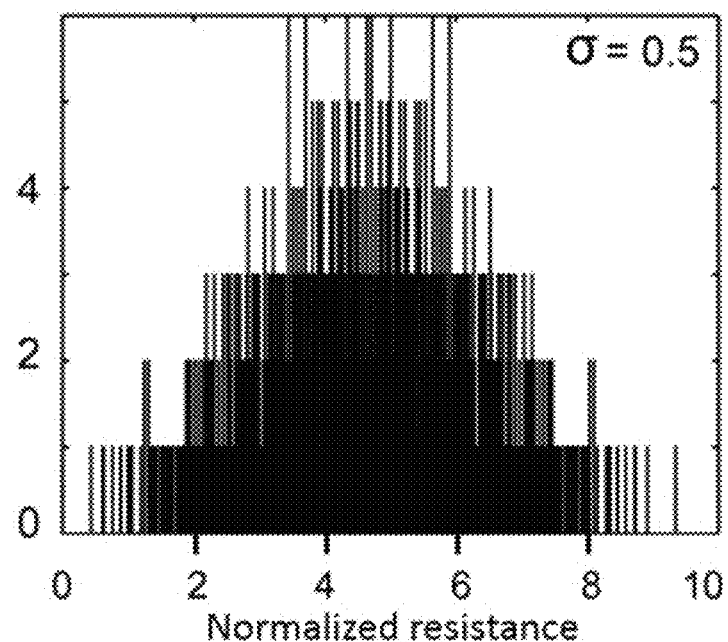
Figures 4A, 4B:
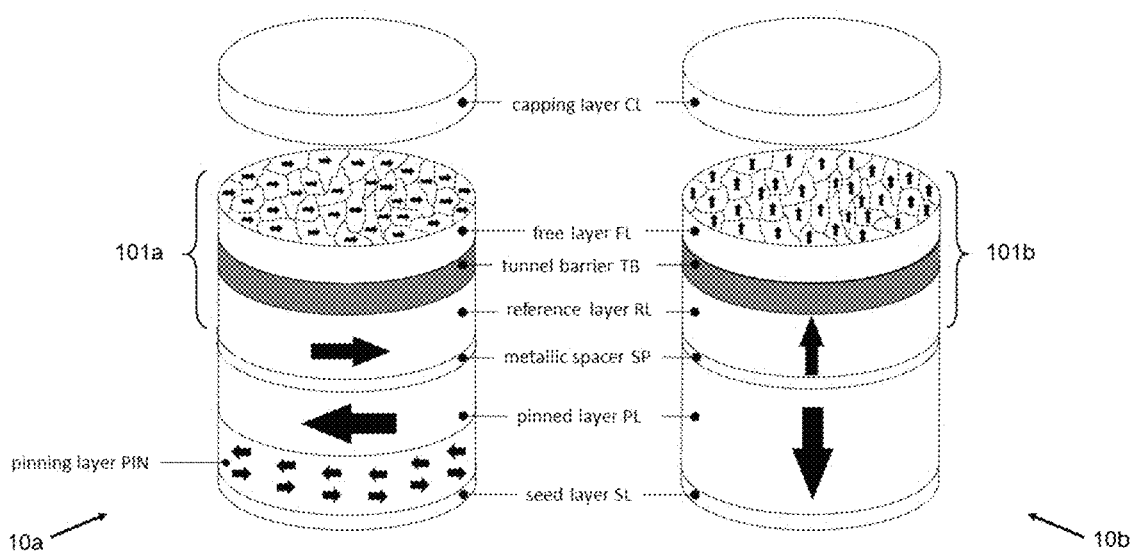
FIGS. 4a and 4b are schematic representations respectively of an in-plane magnetic tunnel junction and of an out-of-plane magnetic tunnel junction according to the invention.

FIG. 4a represents an in-plane spintronic device according to the invention and FIG. 4b represents an out-of-plane spintronic device according to the invention. The magnetization of the free layer FL of each of the spintronic devices 10a and 10b of FIG. 4 is represented in a saturated magnetic state.

Both spintronic devices with in-plane magnetization 10a and with out-of-plane magnetization 10b comprise a magnetic tunnel junction 101a and 101b, the magnetic tunnel junctions 101a and 101b comprising a free layer FL, a tunnel barrier TB and a reference layer RL. The reference layer RL is also called "polarizer" layer as its magnetization is fixed.

The reference layer RL is most often part of a Synthetic Antiferromagnet ("SAF"), as shown at FIG. 4a and FIG. 4b. The invention does not necessarily need a SAF. The SAF comprises two layers antiferromagnetically coupled, separated by a metallic spacer SP. The two layers at FIGS. 4a and 4b are the reference (or polarizer) layer RL and a pinned layer PL.

As shown at FIGS. 4a and 4b, the spintronic devices 10a and 10b are of the "bottom" configuration, meaning that the free layer FL is above the tunnel barrier TB and the reference layer RL is below the tunnel barrier TB. In the "top" configuration, the free layer FL is below the tunnel barrier TB and the reference layer RL is above the tunnel barrier TB. The top configuration is desired when the magnetization of the granular layer is switched by spin-orbit torque ("SOT") since the free layer FL has then to be in contact with a heavy metal line extending below the magnetic tunnel junction ("MTJ") as in conventional SOT-MRAM cells. In contrast, when spin-transfer torque ("STT") is used, both configurations can be used but the bottom configuration is often desired since it generally allows to obtain stronger pinning of the reference layer RL magnetization which is then located at the bottom of the stack. The invention is not limited to a top configuration or to a bottom configuration.

At FIG. 4a, the spintronic device 10a with in-plane magnetized stack, the structure comprises from bottom to top:
- a seed layer SL, for example in Ta, Ru, NiFeCr or an alloy thereof,
- an antiferromagnetic pinning layer PIN, for example in IrMn or PtMn,
- a pinned layer PL, for example in CoFe alloy,
- a metallic spacer SP, for example in Ru or Ir, providing antiferromagnetic RKKY coupling between the magnetization of the two adjacent magnetic layers, i.e. the pinned layer PL and the reference layer RL; this metallic spacer SP can also be a bilayer of Ru and X (with X in Ta or Cu) as described in EP17306063 (Chatterjee et al, 2017),
- a reference layer RL comprising several layers of the form CoFe/Ta/FeCoB where the layer in contact with the metallic spacer SP is chosen to provide strong antiferromagnetic coupling (typically made in Co rich CoFe alloy) and where a structural transition layer (typically in Ta, Mo or W) insures a structural transition between an fcc (face centered cubic) part of the stack and a bcc (body centered cubic) part of the stack,
- a tunnel barrier TB, for instance in MgO, AlOx, TiOx,
- the granular free layer FL,
- a capping layer CL.

In the out-of-plane magnetized stack represented at FIG. 4b, the structure comprises from bottom to top:
- a seed layer SL, for instance in Ta, Ru, Pt or an alloy thereof,
- a pinned layer PL, such as a multilayer containing layers of Co or a CoFe alloy alternating with layers of Pt or Pd, or an ordered alloy such as FePt or FePd,
- a metallic spacer SP, for instance in Ru or Ir, providing antiferromagnetic RKKY coupling between the magnetization of the two adjacent magnetic layers; this spacer SP can also be a bilayer of Ru and X (with X in Ta or Cu) as described in EP17306063 (Chatterjee et al, 2017)
- a reference layer RL comprising itself several layers of the form (Co/Pt)nCo/Ta/FeCoB where the layer in contact with the metallic spacer SP is chosen to provide strong antiferromagnetic coupling together with out-of-plane anisotropy and where a structural transition layer (typically in Ta, Mo or W) insures a structural transition between an fcc (face centered cubic) part of the stack and a bcc part of the stack (body centered cubic), the tunnel barrier TB, for instance in MgO, AlOx or TiOx, the granular free layer FL, a capping layer CL.

The free layer FL of FIGS. 4a and 4b are granular and inhomogeneous, as defined previously. This will be further understood in the following description. First, the different layers of the spintronic devices 10a and 10b will be described.

Reference Layer RL (or Polarizer Layer) and Synthetic Antiferromagnet

A reference layer RL for the present invention can be similar to the one of conventional STT-MRAM or SOT-MRAM. When used with an MgO-based tunnel junction, such a reference layer RL is most often made of a FeCoB alloy in contact with the tunnel barrier TB. More generally, in both in-plane and out-of-plane configurations as represented respectively at FIGS. 4a and 4b, the reference layer RL is chosen in combination with the material for the tunnel barrier TB to obtain a large tunnel magnetoresistance amplitude (typically above 100% and desirably above 200%). As explained previously, a desired couple of materials is FeCoB and MgO having a (001) bcc texture that, in the out-of-plane configuration, is also enhancing the perpendicular magnetic anisotropy.

This reference layer RL is desirably part of a SAF as in a conventional MRAM, to increase the pinning of the reference layer RL magnetization and reduce the stray field exerted by the reference layer RL on the free layer FL magnetization. When used below the tunnel barrier TB and in out-of-plane configuration, the SAF is grown on a seed layer SL to promote a (111) texture. The seed layer SL can be made of Ta or other materials such as Ru, Pt, CuN, or any other suitable material, the material used in the seed layer SL also usable as capping layer CL. The SAF is composed of two antiferromagnetically coupled layers through a thin metallic layer called a "spacer" SP. The coupled layers can be multilayers consisting of several repeats of (Co/Pt) or (Co/Pd) or (Co/Ni) or any other materials known to provide perpendicular anisotropy such as FePt or FePd ordered alloys. When (Co/Pt) is used, the thickness of the Co layers is typically in the range of 0.2 nm to 1 nm and the thickness of the Pt layers typically in the range of 0.2 nm to 1.6 nm.

The thickness of the spacer layer SP, acting as an RKKY antiferromagnetic coupling layer, is chosen to provide a strong antiferromagnetic coupling, for example a coupling energy typically above 1 mJ/m$^2$. Usually, this spacer SP is made of Ru of a thickness comprised between 0.4 nm and 0.9 nm or of Ir. The spacer SP can also be a combination of two or more layers such as Ru/X, with X in Ta or Cu, as described in EP17306063 (Chatterjee et al, 2017).

In addition, a texture breaking layer (not represented) is generally introduced between the reference layer RL in FeCoB in contact with the barrier and the rest of the SAF to insure a structural transition between after the structure of the FeCoB which has to be body centred cubic (bcc with 4-fold symmetry) in the final device and the rest of the SAF which has generally a fcc structure with (111) texture) and 3-fold symmetry. This texture breaking layer is usually made of Ta, W or Mo and has a thickness in the range of 0.2 nm to 0.4 nm. Such texture breaking layer is very desirably present in the invention as well as in the other embodiments described below.

When used in in-plane configuration, the SAF is commonly associated with an antiferromagnetic pinning layer PIN, for instance in PtMn, having a thickness between 14 nm and 25 nm, or in IrMn, having a thickness between 5 nm and 9 nm, which provides exchange bias to the magnetic pinned layer PL of the SAF in contact with it. The SAF is then grown above this antiferromagnetic pinning layer PIN. The SAF constituting ferromagnetic layers usually consists of Co, NiFe or FeCoNi alloys having a thickness between 1 nm and 3 nm.

When the reference layer RL and the SAF are implemented above the tunnel barrier TB, a seed layer does not permit to promote the appropriate texture of the SAF. Other solutions are then possible:

When used in an out-of-plane configuration, multilayers containing repeats of the form (Co/X/Pt) can be used, where X is a refractory metal layer (e.g. Ta or W), as disclosed in the patent application US 20190252601 A1.

When used in an in-plane configuration, the SAF is capped by an antiferromagnetic pinning layer PIN. As in the previous cases, a texture breaking layer is very desirably introduced between the FeCoB of the reference layer RL in contact with the barrier TB (which has a bcc structure with 4 fold symmetry in the final device) and the SAF which is grown above it and has an fcc texture as the antiferromagnetic pinning layer PIN above it.

The two antiferromagnetically coupled components of the ferromagnetic layers thicknesses are desirably adjusted so that their stray field is compensated in average over the volume of the free layer.

Tunnel Barrier TB

The tunnel barrier is an insulating layer through which the electrons tunnel when a bias voltage is applied between the metallic electrodes sandwiching it. It can be made of MgO, AlOx, TiOx, AlN, or any other known material. As in conventional magnetic tunnel junctions, the tunnel barrier TB of the devices 10a and 10b are in an embodiment made of MgO. The optimum resistance*area product of the junction can depend on a design of the neuromorphic circuit, in the case of such an application of the invention. It also depends whether the used writing mechanism is STT or SOT. In case STT is used as a writing mechanism to modify the magnetization orientation of the granular free layer FL, the resistance*area product ("RxA") of the tunnel barrier TB is chosen in the range of 10 $\Omega \cdot \mu m^2$ to 20 $\Omega \cdot \mu m^2$ to avoid an excessive voltage at the current density required for the STT writing. This is realized while maintaining a high tunnel magnetoresistance (TMR) value, for example of 100% and in an embodiment above 200%. In case SOT is used as write mechanism, the resistance*area product of the tunnel barrier TB can be higher and optimized to achieve an even higher tunnel magnetoresistance value for instance above 240%.

Free Layer FL

The granular free layer FL according to the invention comprises grains small enough so that in the patterned device, the number of grains is large enough to provide a sufficient number of intermediate resistance states. The granular free layer FL comprises at least two grains, so as to have at least one intermediate resistance state. Thanks to the invention, the number of intermediate states increases with the number of grains. The grains have in an embodiment a diameter below 30 nm, for example below 10 nm. However, the grains should not be too small so as to be thermally stable as explained later in the description. In an embodiment, the granular free layer FL provides a large TMR amplitude.

The grains of the granular free layer FL can be switched individually, in a probabilistic way, by applying pulses of current using STT or SOT mechanisms. It is understood by "switching" a grain, the modification of the orientation of the magnetization of the grain, such that the magnetization orientation after a switch of the grain is in a direction opposed or sensibly opposed to the magnetization orientation before the switching.

The grains are magnetically decoupled or weakly coupled across their grain boundaries to be able to switch the grains individually or by small groups of grains. It is understood by "sensibly decoupled" that two adjacent grain are magnetically decoupled or weakly coupled. It is understood by "decoupled or weakly coupled" the fact that the exchange coupling between adjacent grains though their grain boundary is sufficiently weak so that the magnetization of a given grain can be reversed without yielding the reversal of the magnetization of the adjacent grain. As explained before, this means that the intergrain coupling energy integrated over the lateral area of a given grain should not exceed half of the effective anisotropy energy of the considered grain integrated on its volume.

The grains of the granular free layer FL are very desirably sufficiently thermally stable to achieve the desired retention of the memristor, when such an application is wanted. It is known that the retention time $\tau$ is given by an Arrhenius law such as $\tau=\tau_0 \exp(\Delta E/k_B T)$ where $\tau_0$ is the attempt time of the order of 1 ns, $k_B$ is the Boltzman constant, T is the temperature and, in the case of fully decoupled grains, $\Delta E=K_{eff}V$ is the energy barrier separating the two stable states of grain magnetization with $K_{eff}$ the grain effective anisotropy and V the volume of the grain. In the case where the grains are weakly coupled, the energy barrier for switching would be reduced by the coupling energy with the neighbouring grains. Since the retention is strongly related to the grain volume, a tradeoff has to be found in the grain size to have simultaneously a high enough number of grains per free layer FL of the memristor and an adequate memristor retention. Typically, a grain size of a few nanometers in diameter will be desired, for example between 3 nm and 30 nm.

Hereafter, two ways of achieving a granular free layer FL according to the invention are described.

Figure 5A:
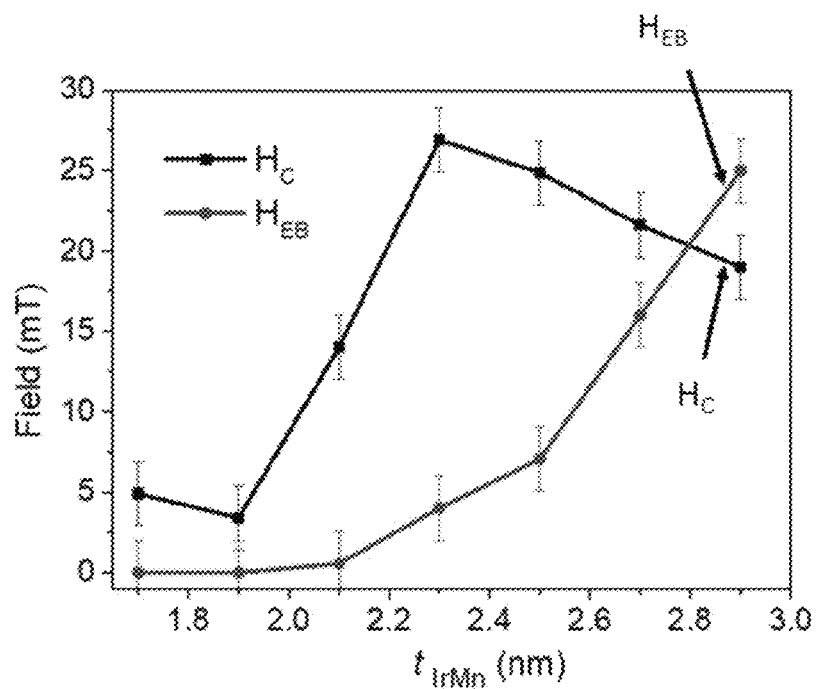
FIG. 5a shows the variation of coercivity (Hc) and of exchange bias field (HEB) as a function of the thickness tIrMn of an antiferromagnetic layer made of IrMn in a granular free layer according to a first embodiment of the invention.
Figure 6A:
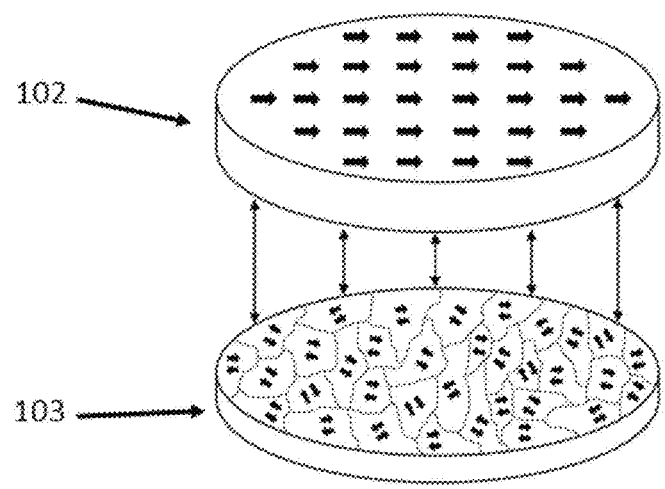
FIGS. 6a and 6b are schematic representations respectively of a first and second embodiment according to the invention.

A first embodiment for achieving a granular free layer FL is based on a bilayer structure comprising a ferromagnetic (FM) layer 102 coupled to an antiferromagnetic (AF) layer 103 as represented in FIG. 6a. The thickness of the antiferromagnetic layer 103 in the free layer FL is set in a way not to induce exchange bias (i.e. not to have a loop shift $H_{EB}$) but, for a critical thickness range, to still have a strong increase in the coercive field ($H_c$) of the bilayer, as represented in FIG. 5a. It is a general feature of ferromagnetic (F)/antiferromagnetic (AF) bilayers to present a maximum of coercivity at the thickness of the AF layer 103 at which there is an onset of the exchange bias. As an example, FIG. 5a represents the variation of coercivity ($H_c$) and of exchange bias field ($H_{EB}$) as a function of the thickness $t_{IrMn}$ of an antiferromagnetic layer 103 made of IrMn in an F/AF bilayer. The critical thickness at which the maximum of coercivity occurs is of the order of 2.3 nm. It corresponds to the thickness at which the exchange bias field starts to rise. In these sputtered materials, both the antiferromagnetic layer 103 and ferromagnetic layer 102 are polycrystalline with grain sizes typically ranging between 5 nm and 20 nm. The critical thickness depends on the magnetic properties of the material of the antiferromagnetic layer 103. Typically, for an antiferromagnetic layer 103 in IrMn, such critical thickness is found around 2 nm while for an antiferromagnetic layer 103 in PtMn and FeMn, the critical thickness is slightly higher, around 4 nm.

It will be understood by "AF grain" a grain of the antiferromagnetic layer 103, and by "F grain" a grain of the ferromagnetic layer 102. Below the critical thickness antiferromagnetic layer 103, upon switching of the magnetization of the ferromagnetic layer 102, the anisotropy of the AF grains is not sufficient for the spin lattice of the AF grains to resist the torque exerted by the magnetization of the ferromagnetic layer 102 on the spin lattice of the AF grains through interfacial exchange. As a result, the spin lattice of the AF grains itself switches which creates dissipation and therefore coercivity. Since the dissipated energy in the antiferromagnetic layer 103 is roughly proportional to the grain volume, the coercivity increases up to the critical thickness at which it reaches a maximum. Above this critical thickness, the anisotropy of the largest grains starts to be sufficient for the AF spin lattice in these grains not to be dragged upon switching of the magnetization of the ferromagnetic layer 102. These stable grains no longer dissipate energy so no longer contribute to the coercivity but instead exert a torque on the magnetization of the ferromagnetic layer 102 through the interfacial F/AF exchange which manifests itself as a loop shift on the hysteresis loop of the ferromagnetic layer 102.

Figure 5B:
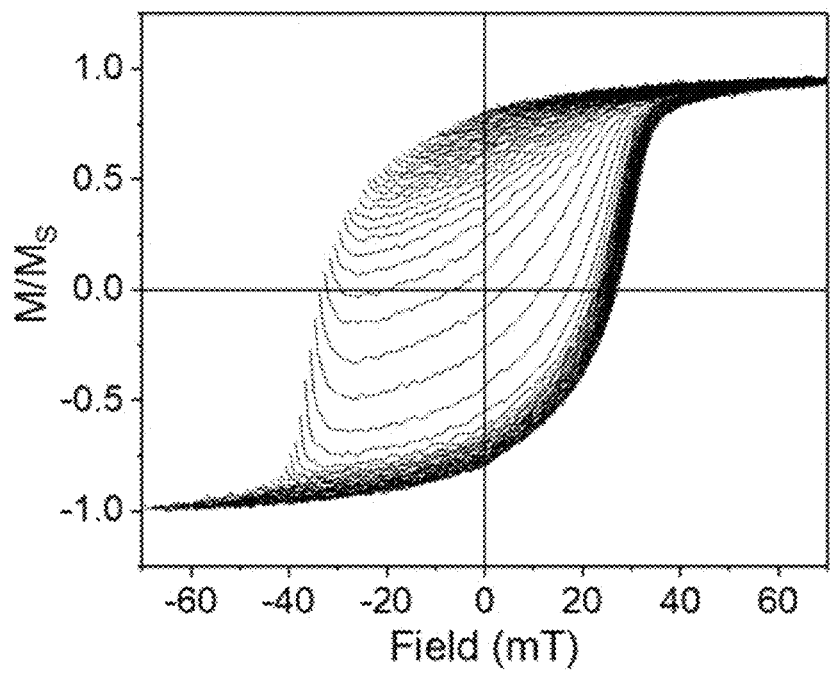
FIG. 5b shows a set of experimental minor hysteresis loops for a granular free layer according to a first embodiment of the invention.

Around the critical thickness of the antiferromagnetic layer 103, the micromagnetic behavior of the F/AF bilayer is rather incoherent upon cycling due to the dragging of the spin lattice of each individual AF grain. This is illustrated in FIG. 5b, where minor hysteresis loops were performed on a bilayer of composition NiFe 3 nm/IrMn 2.3 nm. FIG. 5b shows a set of experimental minor hysteresis loops, of the normalized magnetization (M/Ms) as a function of magnetic field, with intermediate states (FORC curves) of a sample composed by Co(0.5)/Py(1)/IrMn(2.1)/Py(1)/Co(0.5)/Ta(0.3)/FeCoB(1.2) where the unit of the value in parenthesis is nm. FIG. 5b shows that when performing a minor hysteresis loop sweeping the field back and forth from positive saturation to a value $-H_{min}$, any intermediate level of remanent magnetization can be achieved on the ascending branch of the hysteresis loop. This reveals the granular character of the micromagnetic behavior of these F/AF coupled systems which can yield to multi-domain configurations as illustrated in FIG. 6c.

Concerning the ferromagnetic layer 102 itself, materials like Co, NiFe and FeCoB can be used with a thickness adjusted so as to obtain an in-plane or an out-of-plane magnetized ferromagnetic layer 102 by acting on the bulk and interfacial anisotropy. When this bilayer is incorporated as the granular free layer FL in a magnetic tunnel junction as in FIG. 4, a composite ferromagnetic layer 102 will be desired to combine a good coupling with the antiferromagnetic layer 103 and a large tunnel magnetoresistance by using FeCoB at the interface with the MgO tunnel barrier TB.

The samples can be deposited by sputtering or other Physical Vapor Deposition technique. As in conventional MgO-based MTJ for MRAM cells, they have to be annealed after deposition at a temperature high enough to crystallize the MgO barrier and the FeCoB in a bcc 001 texture (typically higher than 250° C. or even 300° C.).

As explained previously, when used in in-plane configuration, the SAF in the MTJ is most often coupled to another AF layer which is intended to pin the magnetization of the SAF ferromagnetic layer adjacent to it. In this case, this AF layer should be thicker than the AF layer within the granular layer. Indeed, since this AF layer coupled to the SAF is intended to pin the magnetization of the SAF, it should have a thickness which provides a large loop shift, typically 7 nm for IrMn or 15 to 20 nm for PtMn. Furthermore, as well known by the man skilled in the art, to set the exchange bias field direction, the MTJ should be annealed above the AF blocking temperature under a magnetic field large enough to saturate the ferromagnetic layer magnetization of the SAF adjacent to the AF in the desired direction. This anneal can be the same as the one required to recrystallize the MgO barrier and the FeCoB electrodes but in presence of a magnetic field or can be performed after the first one. During these anneals, it is important to pay attention to the possible interdiffusion of the metallic elements constituting the AF/SAF stack (in particular Mn diffusion) as well known by the man skilled in the art.

Figure 6B:
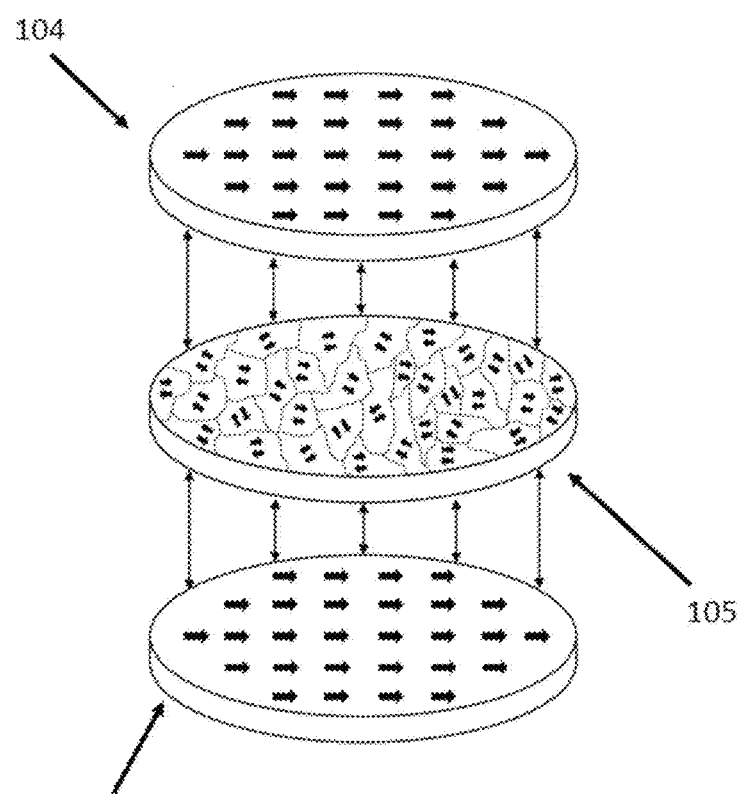
Figure 6C:
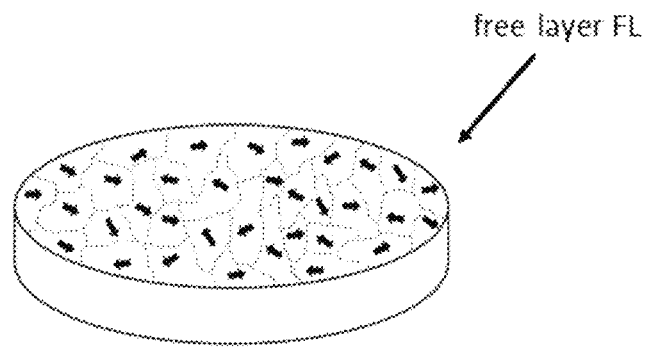
FIG. 6c is a schematic representation of a granular free layer according to the invention.

For the granular free layer FL, instead of using a bilayer F/AF as illustrated in the embodiment of FIG. 6a, a second possible embodiment permits to achieve such granular free layer FL with a trilayer structure F/AF/F as in FIG. 6b. In this case, the thin nature of the films and the strong interaction between them allows them to behave as a unique magnetic layer with a multi-domain state as shown in FIG. 6c.

Moreover, in the case of an out-of-plane magnetic tunnel junction, it is possible to insert the granular free layer FL between two MgO layers (not represented) to increase the out-of-plane magnetic anisotropy by benefiting from the interfacial anisotropy at the MgO/granular free layer FL and granular free layer FL/MgO interfaces. The structure of the granular layer can then be of the form MgO 1.2 nm/FeCoB 0.8 nm/Ta 0.2 nm/NiFe 0.6 nm/IrMn 2 nm/NiFe 0.4 nm/Ta0.2 nm/FeCoB0.8 nm/MgO 1 nm/.

Figure 7A:
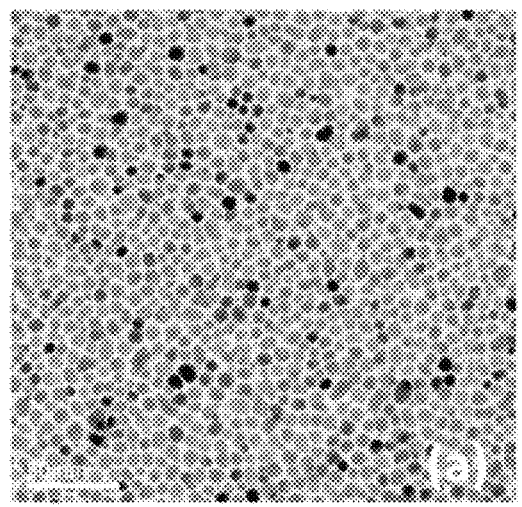
FIG. 7a is a TEM image of a granular media of the state of the art of FePtAg—C.

A third possible embodiment for achieving a granular free layer FL comprises manufacturing a granular free layer by mixing immiscible magnetic and non-magnetic materials. In an embodiment, the resulting granular free layer FL structure consists of magnetic grains separated by non-magnetic grain boundaries as for example FeCoB grains separated by $Al_2O_3$ grain boundaries as shown in FIG. 7a. FIG. 7a is a TEM image of a granular media of the state of the art of FePtAg—C, as extracted from [D. Weller, G. Parker, O. Mosendz, E. Champion, B. Stipe, X. Wang, T. Klemmer, G. Ju and A. Ajan, *A HAMR Media Technology Roadmap to an Areal Density of 4 Tb/in²*, IEEE TRANSACTIONS ON MAGNETICS, VOL. 50, NO. 1 (2014).]. In a spintronic application of the invention, the presence of an insulating non-magnetic material ensures better transport properties such as tunnel magnetoresistance and STT. The resulting material turns out to be similar to the one used for recording media technology with however thinner magnetic layers so that they can be switched by STT or SOT, according to the invention.

In the invention, the relative content of the two materials is chosen based on the desired ratio between the area of the magnetic grains and the thickness of the separating non-magnetic grain boundaries. The size of the grains is desirably small enough to allow good statistics in a relatively small magnetic tunnel junction pillar (below 100 nm) and is desirably big enough to have a sufficient anisotropy to not be superparamagnetic at room temperature. In an embodiment, sizes between 3 nm and 30 nm will be chosen. The thickness of the grain boundaries is chosen to reduce sufficiently the exchange coupling between neighboring grains so that their magnetization can be switched independently. By "reducing sufficiently the exchange coupling between neighboring grains" it is meant that the effective exchange stiffness constant within the grain boundary volume is reduced by at least a factor 2 compared to the exchange stiffness in the bulk of the magnetic grains. Typical appropriate grain boundary thicknesses are in the range of 1 nm to 2 nm. The magnetization of the granular free layer of this third embodiment can have an in-plane or out-of-plane configuration by properly balancing the interfacial perpendicular anisotropy and the bulk anisotropy, which can have different origins: magnetostatics, magnetocrystalline or magnetostriction.

A granular free layer FL according to the third embodiment can be achieved using different procedures:

By co-sputtering a magnetic material (typically FeCoB if MgO is used as a tunnel barrier TB) and $Al_2O_3$ or other oxide or nitride materials immiscible with the magnetic material. The immiscibility of those materials allows the immediate formation of grains of magnetic phase surrounded by grain boundaries of the other material, ending up with a granular structure according to the invention.

By co-sputtering a magnetic material and a metallic element whose oxide has a more negative heat of formation than the magnetic material, with a final oxidation step by natural oxidation or by an oxygen plasma, for example by co-sputtering FeCoB and Al, with the final oxidation step by natural oxidation of Al in Alumina or by an oxygen plasma. In this case, the oxygen tends to form $Al_2O_3$ because of the negatively larger heat of formation of Alumina with respect to the MgO or Fe- or Co-oxide. "Negatively larger" means that the heat of formation is negative (exothermic formation) and has larger absolute value.

By depositing multilayers of ultrathin bilayers, each bilayer comprising a layer of a magnetic material, typically FeCoB if MgO is used as a tunnel barrier TB, and a layer of an oxide or nitride material immiscible with the magnetic material, such as $Al_2O_3$ for FeCoB. Annealing at temperatures above 250° C. then leads to demixing and grains formation. For example, such a granular layer can be obtained by depositing a multilayer of ultrathin $(FeCoB/Al_2O_3)_n$ and then by annealing at temperatures above 250° C.

By depositing multilayers of ultrathin bilayers, each bilayer comprising a layer of a magnetic material, typically FeCoB, and a layer of a metallic element whose oxide has a more negative heat of formation than the magnetic material, for example Al when FeCoB is used as a magnetic material, with a final oxidation step by natural oxidation or by an oxygen plasma. Annealing at temperatures above 250° C. then leads to demixing and grains formation. For example, such a granular layer can be obtained by depositing a multilayer of ultrathin $(FeCoB/Al)_n$, with n being the number of repeats, with a final oxidation step. As in the second case of the third embodiment, the formation of alumina is favored and a post annealing, as in the previous case, permits the creation of grains.

In all the four cases of the third embodiment presented in the previous paragraph, the annealing both induces the crystallization of the tunneling barrier TB of the magnetic tunnel junction and induces or further favors the demixing of the two materials constituting the granular free layer FL.

Figure 7B:
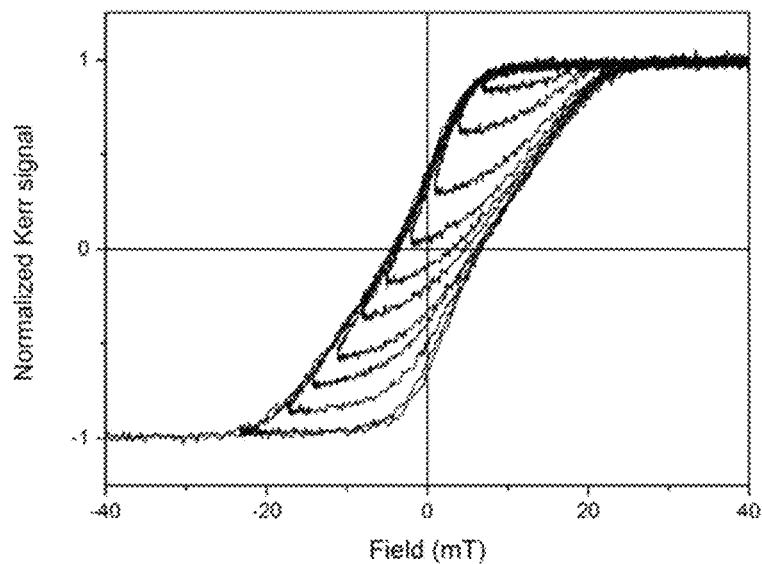
FIG. 7b is a schematic representation of a hysteresis loop of a granular free layer according to a third embodiment of the invention

An example of set of minor hysteresis loops of such resulting material for the granular free layer FL of the third embodiment is shown in FIG. 7b. FIG. 7b is a set of experimental minor hysteresis loops with intermediate states (FORC curves) for a sample composed by Mg(0.7)/Ox(30 sec-0.03 mbar)/Mg(0.4)/FeCoB(0.25)/Al(0.25)/FeCoB (0.25)/Ta(0.2)/FeCoB(0.25)/Al(0.25)/FeCoB(0.25)/Ox(10 sec 150 mbar)/Mg(0.7)/Ox(30 sec-0.03 mbar)/Al(0.5), with the values in parenthesis in nanometers when unspecified. Its shape reveals again a distribution of switching field associated with the granularity of the free layer FL. As shown in FIG. 7b, it is possible to gradually switch the granular structure by field as demonstrated by the several intermediate remanent states present in the loop.

Writing/Reading Operations

Figure 8A:
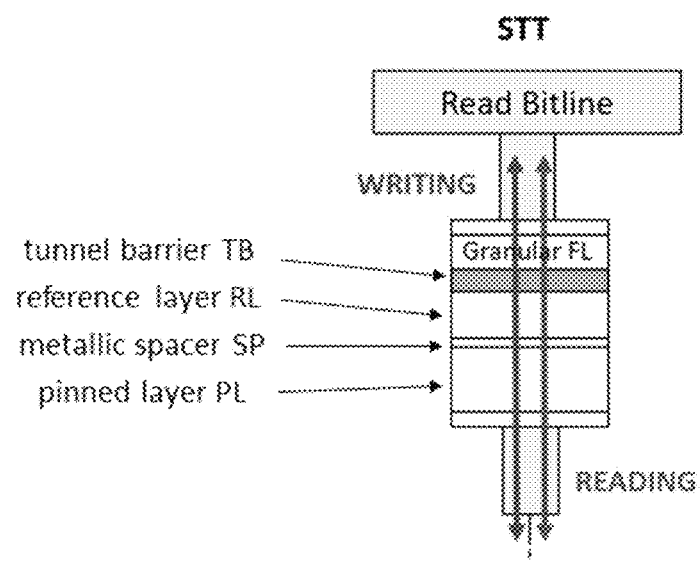
FIGS. 8a and 8c is a schematic representation of a magnetic tunnel junction according to the invention switched using respectively STT and SOT mechanisms.
Figure 8B:
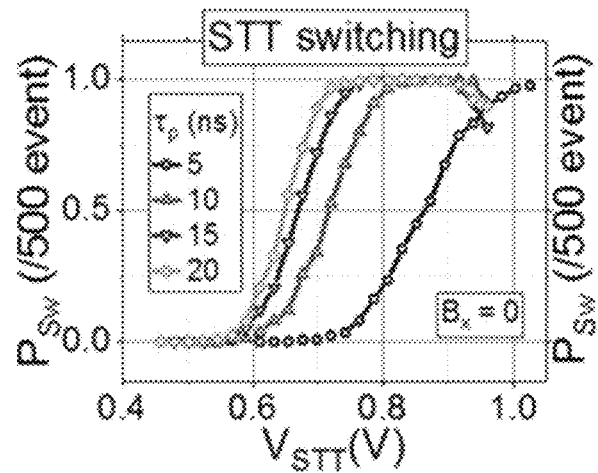
FIGS. 8b and 8d show respectively STT and SOT switching probability dependence on pulse amplitude for different pulse lengths on a known respectively STT and SOT device.

A first possible switching mechanism is driven by current pulses flowing through the magnetic tunnel junction 10a or 10b by direct spin transfer-torque STT. This case is represented at FIG. 8a, where the spin of the current is polarized by passing through the reference (or polarizer) layer RL. After tunneling, due to conservation of angular momentum, the spin-polarized tunneling electrons exert a torque on the local magnetization of the granular free layer FL. For the granular free layers FL according to the different embodiments of the invention, it is possible to adjust the current pulses in terms of amplitude and duration so that at each pulse a certain fraction of the grains switch in one direction or on the opposite direction depending on the polarity of the pulse. A first reason for this is the distribution of grain size. Due to their different volumes, the switching current of each grain can be different. This means that with a certain injected current pulse (defined in amplitude and duration) only a certain percentage of grains will be able to switch. To further switch an additional fraction of them, the pulse amplitude and/or duration is increased. However, even if the grain size distribution is very narrow, at each pulse, the grains will have a certain probability to switch due to the stochastic character of the switching associated to thermal fluctuations. FIG. 8b shows STT switching probability dependence on pulse amplitude for different pulse lengths and at zero field on a known STT device, as extracted from [K. Garello, F. Yasin, S. Couet, L. Souriau, J. Swerts, S. Rao, S. Van Beek, W. Kim, E. Liu, S. Kundu, D. Tsvetanova, N. Jossart, K. Croes, E. Grimaldi, M. Baumgartner, D. Crotti, A. Furnémont, P. Gambardella, G. S. Kar, *SOT-MRAM 300 mm integration for low power and ultrafast embedded memories,* 2018 *IEEE Symposium on VLSI Circuits,* 978-1-5386-4214-6 (2018).]. By properly designing the pulse, i.e. by properly pre-defining different pulse durations and/or amplitudes, it is possible to reach different values of switching probability allowing the statistical switching of the same percentage of grains. In this way, an intermediate magnetic configuration appears as a multi-domain state for which each domain has the size of one or few grains.

Figure 8C:
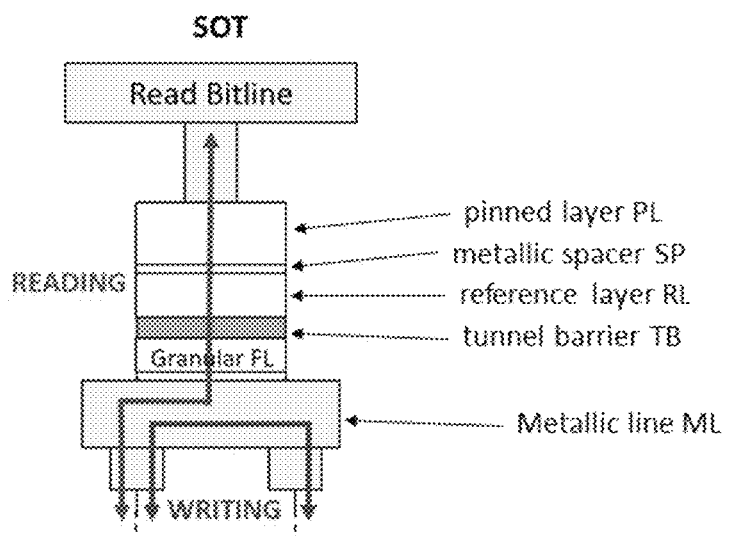
Figure 8D:
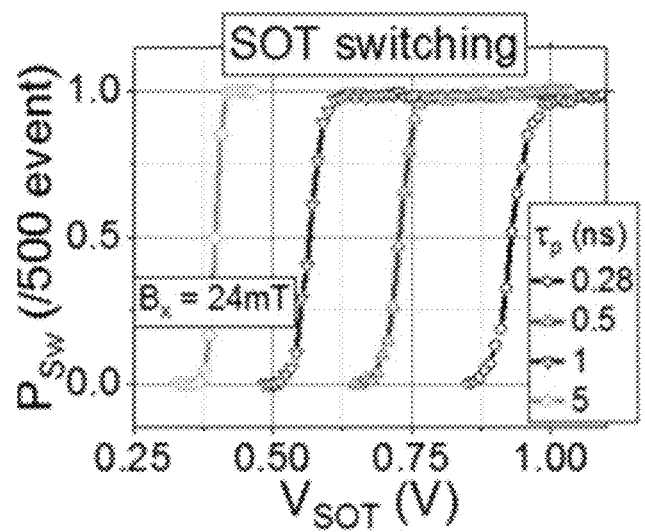

Similarly, the SOT effect can be used as a switching mechanism. This case is represented at FIG. 8c, where the structure of the device includes a metallic line ML directly coupled (or coupled through a metallic spacer) to the granular free layer FL. The material of the metallic line ML is properly chosen to have a high spin orbit coupling such as for example Pt, Ta, other heavy metals or any other suitable material. In this configuration, the current flows through the metallic line ML without passing through the device as shown in FIG. 8c. This reduces the electrical stress on the tunnel barrier TB at each write pulse and consequently increases the write endurance of the device. Thanks to the spin-orbit coupling, Rashba effect and/or Spin Hall effect create a spin current in the perpendicular direction acting directly on the magnetization of the free layer FL as a torque. FIG. 8d shows SOT switching probability dependence on pulse amplitude for different pulse lengths and in-plane field of 24 mT on a known SOT device, as extracted from [K. Garello, F. Yasin, S. Couet, L. Souriau, J. Swerts, S. Rao, S. Van Beek, W. Kim, E. Liu, S. Kundu, D. Tsvetanova, N. Jossart, K. Croes, E. Grimaldi, M. Baumgartner, D. Crotti, A. Furnémont, P. Gambardella, G. S. Kar, *SOT-MRAM 300 mm integration for low power and ultrafast embedded memories,* 2018 *IEEE Symposium on VLSI Circuits,* 978-1-5386-4214-6 (2018).]. As in the previous case, a proper designing of the current pulses in terms of amplitude and duration can statistically switch a certain percentage of grains in the granular free layer FL according to the invention.

Independently of the writing mechanism, if the granular free layer FL of a patterned memristor or multivalued memory cell is constituted of N grains, it will be desirable to choose the amplitude and duration of the voltage pulse so that the probability of switch of the grains is of the order of k/N, with k an integer inferior to N, desirably close to 1. This will allow at each pulse to switch just k (i.e. one or a few) grains among the N grains. For instance, if the switching probability of the cell is as described at FIG. 8b, for a granular layer containing 10 grains, it would be interesting to use pulses of voltage having an amplitude between 0.6V and 0.65V.

Further, the tunnel magnetoresistance can be used as a reading mechanism. As in conventional MRAMs, the use of combinations of materials, such as FeCoB/MgO/FeCoB, allows a coherent spin dependent tunneling through specific transport channels which yields large tunnel magnetoresistance amplitude. That way, the resistance of the device depends on the relative magnetic configuration of the reference (or polarizer) layer RL and of the granular free layer FL. In such a device, the two extreme cases in which the magnetization of the granular free layer FL is uniformly saturated parallel "P" or antiparallel "AP" to the magnetization of the reference layer RL correspond respectively to the lowest and highest resistance values. All the other multi-domain configurations are read as intermediate resistance states.

The use of magnetic tunnel junctions with out-of-plane configurations has several benefits with respect to the in-plane one. One is the strong interfacial anisotropy at magnetic metal/oxide interface which allows to get good thermal stability of the grains even in small grains of just a few nanometers in diameter. For in-plane magnetic tunnel junctions, the thermal stability of the grains is provided by the thin antiferromagnetic layer inserted in the granular free layer FL (such as IrMn or PtMn) which yields high Gilbert damping. As a result, the write current in out-of-plane devices is lower than in the in-plane devices, allowing lower power consumption and better scalability.

Figure 9:
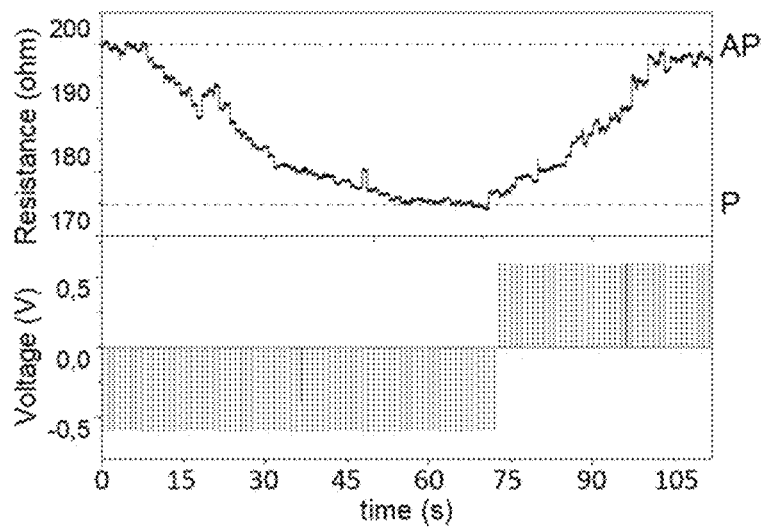
FIG. 9 shows the resistance variation of an in-plane magnetic tunnel junction with a granular free layer according to the third embodiment of the invention with a train of pulses each of 0.6V and 2 ns duration.

An example of writing by STT and reading by tunnel magnetoresistance is shown in FIG. 9 as obtained experimentally. A train of positive and negative voltage pulses of 0.6V of amplitude and of duration of 2 ns is applied to an in-plane magnetized magnetic tunnel junction with a granular free layer FL realized with a trilayer structure as in the second embodiment of the invention shown in FIG. 6b. The device has a diameter of 200 nm and an RxA (resistance*area product) of 10 $\Omega\mu m^2$. The resistance is gradually varying in a roughly monotonous way with the voltage polarity achieving a sensibly continuous range of intermediate resistance states between the P and AP state.

Nanofabrication

The MRAM integration technology is developing fast achieving recently 1 Gb integrated memory. The devices presented here can follow known processes to be patterned in nano-pillars with diameters below 100 nm. For the manufacturing of such devices, a hard mask is deposited on top of the device, as for example 150 nm of Ta. A lithographic step made by DUV ("Deep Ultraviolet Lithography") or EUV ("Extreme ultraviolet lithography") can precisely define small features in the lithography resist such as cylindrical pillars of diameters from a few nm to several hundreds of nm. After removal of the non-insolated resist, RIE ("Reactive-Ion Etching") etching is used to create small nano-pillars with the previous diameters. These nanopillars constitute the hard mask. Then, a subsequent IBE ("Ion Beam Etching") step allows patterning the magnetic stack under them. An insulating material such as a polymer or an oxide like $SiO_2$ is then deposited to protect the pillar and to separate the bottom contact from the top one. A CMP ("Chemical Mechanical Planarization") step can then be used to flatten the oxide surface and open the top electrical contact before the deposition of a top metallic electrode.

The invention claimed is:

1. A multivalued non-volatile memory element comprising a magnetic tunnel junction, the magnetic tunnel junction comprising at least one free layer configured to provide a tunnel magnetoresistance signal, at least one reference layer, and at least one tunnel barrier separating the free layer and the reference layer, wherein the free layer configured to provide a tunnel magnetoresistance signal is an inhomogeneous granular layer comprising at least two grains, each grain of the at least two grains being sensibly magnetically decoupled from the other adjacent grains of the at least two grains when an intergrain coupling energy integrated over a lateral area of said grain does not exceed half of an effective anisotropy energy of said grain integrated on its volume, wherein the multivalued non-volatile memory element is a magnetic random-access memory element of the spin-orbit torque type or SOT-MRAM (Magnetic Random-Access Memory), wherein the inhomogeneous granular free layer is at least a bilayer comprising a ferromagnetic layer and an antiferromagnetic layer.

2. The multivalued non-volatile memory element comprising a magnetic tunnel junction according to claim 1, wherein the grains have a size comprised between 3 nanometers and 30 nanometers.

3. The multivalued non-volatile memory element comprising a magnetic tunnel junction according to claim 1, wherein the inhomogeneous free layer is at least a trilayer comprising two ferromagnetic layers separated by an antiferromagnetic layer.

4. The multivalued non-volatile memory element comprising a magnetic tunnel junction according to claim 1, wherein the inhomogeneous free layer comprises a heterogeneous alloy of at least two immiscible phases, the alloy comprising at least a magnetic material and a non-magnetic material.

5. The multivalued non-volatile memory element comprising a magnetic tunnel junction according to claim 4, wherein the non-magnetic material is an oxide.

6. The multivalued non-volatile memory element comprising a magnetic tunnel junction according to claim 1, wherein the free layer is manufactured according to any one of the following processes:

a first process comprising co-sputtering a magnetic material and an oxide or nitride material immiscible with the magnetic material, a second process comprising:
co-sputtering a magnetic material and a metallic element whose oxide has a more negative heat of formation than the magnetic material, and
an oxidation step by natural oxidation or by an oxygen plasma, a third process comprising:
depositing multilayers of ultrathin bilayers, each bilayer comprising a layer of a magnetic material and a layer of an oxide or nitride material immiscible with the magnetic material, and
annealing at temperatures above 250° C., a fourth process comprising:
depositing multilayers of ultrathin bilayers, each bilayer comprising a layer of a magnetic material and a layer of a metallic element whose oxide has a more negative heat of formation than the magnetic material,
an oxidation step by natural oxidation or by an oxygen plasma, and
annealing at temperatures above 250° C.

7. A process of writing a multivalued non-volatile memory element according to claim 1, the process comprising applying a current pulse of a predefined amplitude and duration to reverse a magnetization orientation of at least part of the grains of the inhomogeneous granular free layer.

8. The process according to claim 7, wherein the amplitude and duration are predefined such that a probability of reversing the magnetization orientation of the at least part of the grains of the inhomogeneous free layer by applying the current pulse is k/N, with k a number inferior to N and with N the number of grains of the inhomogeneous granular free layer.

9. Memristor comprising a multivalued non-volatile element according to claim 1.

10. Neuromorphic circuit comprising at least a memristor according to claim 9.

* * * * *